US008954479B2

(12) United States Patent
Chao et al.

(10) Patent No.: US 8,954,479 B2
(45) Date of Patent: Feb. 10, 2015

(54) END-TO-END INTEROPERABILITY AND WORKFLOWS FROM BUILDING ARCHITECTURE DESIGN TO ONE OR MORE SIMULATIONS

(71) Applicant: International Business Machines Corporation, Armonk, NY (US)

(72) Inventors: Tian-Jy Chao, Bedford, NY (US); Younghun Kim, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 188 days.

(21) Appl. No.: 13/648,785

(22) Filed: Oct. 10, 2012

(65) Prior Publication Data

US 2013/0338971 A1 Dec. 19, 2013

Related U.S. Application Data

(60) Provisional application No. 61/659,134, filed on Jun. 13, 2012.

(51) Int. Cl.
*G06F 7/00* (2006.01)
*G06F 17/30* (2006.01)

(52) U.S. Cl.
USPC .......................................................... 707/804

(58) Field of Classification Search
CPC ................................................ G06F 17/30294
USPC .......................................................... 707/804
See application file for complete search history.

(56) References Cited

U.S. PATENT DOCUMENTS

| 6,708,186 | B1 * | 3/2004 | Claborn et al. ............... 707/754 |
| 7,275,237 | B1 | 9/2007 | Schnieder et al. |
| 2006/0190312 | A1 | 8/2006 | Onuma et al. |
| 2008/0015823 | A1 * | 1/2008 | Arnold et al. ..................... 703/1 |
| 2008/0281573 | A1 * | 11/2008 | Seletsky et al. .................. 703/17 |
| 2010/0106674 | A1 * | 4/2010 | McLean et al. .................. 706/52 |
| 2011/0093424 | A1 | 4/2011 | Zimmermann et al. |

(Continued)

OTHER PUBLICATIONS

"Building SMART", http://www.buildingsmart-tech.org/specifications/ifc-view-definition.com, Copyright 2008-2012 (printed on Oct. 3, 2012).

(Continued)

*Primary Examiner* — Fred I Ehichioya
*Assistant Examiner* — Kris Mackes
(74) *Attorney, Agent, or Firm* — Scully, Scott, Murphy & Presser, P.C.; Louis J. Percello, Esq.

(57) ABSTRACT

An end-to-end interoperability and workflows from building architecture design to one or more simulations, in one aspect, may comprise establishing a BIM enablement platform architecture. A data model defines data entities and entity relationships for enabling the interoperability and workflows. A data definition language may be implemented that defines and creates a table schema of a database associated with the data model. Data management services and/or application programming interfaces may be implemented for interacting with the data model. Web services may also be provided for interacting with the data model via the Web. A user interface may be implemented that communicates with users and uses the BIM enablement platform architecture, the data model, the data definition language, data management services and application programming interfaces to provide functions to the users to perform work related to building information management.

20 Claims, 7 Drawing Sheets

(56) References Cited

U.S. PATENT DOCUMENTS

| | | | |
|---|---|---|---|
| 2011/0209081 | A1 | 8/2011 | Chen et al. |
| 2011/0307281 | A1 | 12/2011 | Creveling et al. |
| 2012/0203806 | A1* | 8/2012 | Panushev ................ 707/825 |
| 2012/0215500 | A1 | 8/2012 | Ciuti et al. |
| 2012/0296609 | A1 | 11/2012 | Khan et al. |
| 2013/0144546 | A1* | 6/2013 | Brackney et al. ............ 702/61 |
| 2013/0218924 | A1 | 8/2013 | Kim et al. |

OTHER PUBLICATIONS

"XQuery 1.0: An XML Query Language (Second Edition)", http://www.w3.org/TR/xquery/, Dec. 14, 2010 (printed on Oct. 3, 2012).

http://www.underground.com, Copyright 2012, (printed on Oct. 3, 2012).

"XML Editor, Data Management, UML and Web Services Tools", http://www.xmlspy.com, Copyright 2005-2012 Altova, (printed on Oct. 3, 2012).

Rodriguez, A., "RESTful Web services: The basics", http://www.ibm.com/developerworks/webservices/library/ws-restful/, Nov. 6, 2008, (printed on Oct. 3, 2012).

http://www.w3.org/2001/XMLSchema-instance, (printed on Oct. 3, 2012).

"National Weather Service", http://www.weather.gov, (printed on Oct. 3, 2012).

http://www.buildingsmart-tech.org/ifcXML/IFC2x3/FINAL/IFC2X3.xsd, (printed on Oct. 3, 2012).

"Model View Definitions", http://buildingsmart.com/standards/mvd, (printed on Oct. 3, 2012).

http://apps1.eere.energy.gov/buildings/energyplus/energyplus_about.cfm, May 25, 2012, (printed on Oct. 3, 2012).

* cited by examiner

END-TO-END INTEROPERABILITY AND WORKFLOWS FROM BUILDING ARCHITECTURE DESIGN TO ONE OR MORE SIMULATIONS

CROSS-REFERENCE TO RELATED APPLICATIONS

This application claims the benefit of U.S. Provisional Application No. 61/659,134 filed on Jun. 13, 2012, which is incorporated by reference herein in its entirety.

STATEMENT REGARDING FEDERALLY SPONSORED RESEARCH OR DEVELOPMENT

This invention was made with Government support under Grant No. DE-EE0004261 awarded by Department of Energy. The Government has certain rights in this invention. (IBM Contract No.: 4352-IBM-DOE-4261)

FIELD

The present application relates generally to computers and computer applications, and more particularly to building information management and end-to-end interoperability and workflows from building architecture design to one or more simulations.

BACKGROUND

In Building Information Modeling (BIM), various tools are used by various BIM phases such as architecture design, construction, simulation, and operations, and others, in generating electronic or digital representations of physical and functional characteristics of a facility or building and managing them. Each tool used in one or more of those phases has its own file format. There is no standard other than industry foundation class (IFC), and for the most part, no interoperability among the tools. BIM Tools and File formats used by BIM tools, e.g., include design tools such as Autodesk AutoCAD™ using .DWG and .DWF formats, Revit™ using .RVT and .RFA formats, Google™ Sketchup using .SKP format, simulation tools such as EnergyPlus, an energy simulation tool using .IDF format, Radiance, a lighting simulation tool using .RAD format, CONTAM, an airflow/contaminant simulation using .PRJ format. For the BIM life cycle, all those different kinds of file formats need to be supported. However, current tooling platform typically caters to only one phase, i.e., architecture design, or one type of simulation (e.g., energy simulation, lighting simulation, airflow simulation, or containment simulation), or operations.

BRIEF SUMMARY

A method for an end-to-end interoperability and workflows from building architecture design to one or more simulations, in one aspect, may comprise establishing BIM enablement platform architecture. The method may also comprise defining a data model comprising data entities and entity relationships for enabling the interoperability and workflows. The method may further comprise creating a data definition language for defining and creating a table schema of a database associated with the data model. The method may also comprise implementing data management services and application programming interfaces for interacting with the data model. The method may further comprise implementing a user interface module that communicates with users and uses the BIM enablement platform architecture, the data model, the data definition language, data management services and application programming interfaces to provide functions to the users to perform work related to building information management.

A method for end-to-end interoperability and workflows from building architecture design to one or more simulations, in another aspect, may comprise interacting with a data model via a user interface or an application programming interface or combinations of both integrated on a building information management enablement platform, wherein the data model may comprise at least a user data entity, a user role data entity, a project data entity, an external information data entity, a format mapping data entity, an XML schema data entity, a none XML schema data entity, a model view definition template data entity and a repository data entity, the interacting comprising at least. The method may also comprise creating a user data entity instance and populating one or more fields associated with the user data entity in the user data entity instance. The method may further comprise creating a project data entity instance of the defined data model and populating one or more fields associated with the project data entity instance. The method may also comprise adding external information data for simulation runs into an external information data entity instance. The method may also comprise adding user role information to a user role data entity instance. The method may further comprise creating one or more links to a file format and schema by populating a format mapping data entity instance and a schema data entity instance. The method may also comprise creating a model view definition template data entity instance for translation of a building architecture design output format to a simulation input format, and populating the model view definition template data entity instance. The method may also comprise creating an input file by populating a repository data entity instance to identify the input file and the model view definition template data entity instance. The method may also comprise running a simulation code associated with said one or more simulations with the data of the external information data entity instance and a transformed input file that is transformed using the populated model view definition template data entity instance.

A system for an end-to-end interoperability and workflows from building architecture design to one or more simulations, in one aspect, may comprise BIM enablement platform architecture implemented on a computer system having at one processor. The system may also comprise a data model comprising data entities and entity relationships for enabling the interoperability and workflows. The system may further comprise a data definition language for defining and creating a table schema of a database associated with the data model. The system may also comprise data management services and application programming interfaces for interacting with the data model. The system may also comprise a user interface module, executing on the processor, that communicates with users and uses the BIM enablement platform architecture, the data model, the data definition language, data management services and application programming interfaces to provide functions to the users to perform work related to building information management.

A computer readable storage medium storing a program of instructions executable by a machine to perform one or more methods described herein also may be provided.

Further features as well as the structure and operation of various embodiments are described in detail below with ref-

DETAILED DESCRIPTION

Figure 1:
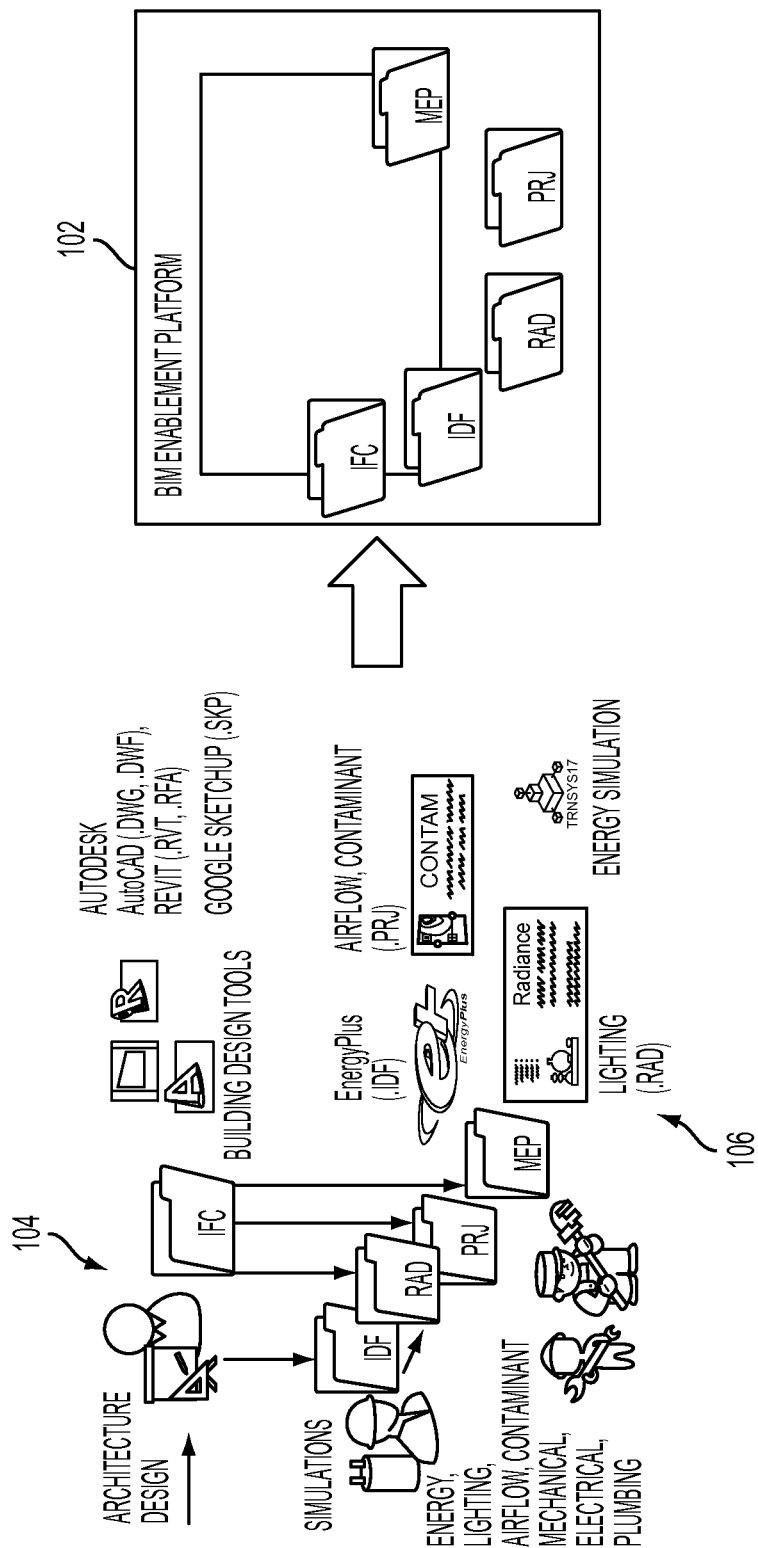
FIG. 1 illustrates various file formats of various BIM tools needed at different phases of a BIM lifecycle and a BIM enablement platform in one embodiment of the present disclosure that enables the holistic and seamless workflow integration across the BIM lifecycle.

In one embodiment of the present disclosure, a BIM enablement platform is presented that can support all the files needed for all phases of the end-to-end BIM life cycle. In addition, a BIM enablement platform of the present disclosure in one embodiment can host all the metadata (e.g., schema, Model View Definition (MVD) Templates (or MVDTemplate) for format translation, etc.), external data (e.g., weather, utility tariff, compliance, tax code, etc.) used for various kinds of simulations, and provide fine grained project based role based access control to enable secure and efficient execution of the BIM workflow life cycle, e.g., energy, lighting, airflow, contaminant simulations. In one aspect, the BIM enablement platform of the present disclosure provides data model, data management services, application programming interfaces (APIs) to support the hosting of BIM data and related meta data, the BIM format exchange from architectural design files to various simulation files, e.g., building simulations, e.g. energy, lighting, airflow, contaminant simulations, as well the enablement of the BIM workflow from design, simulation, to operations. The BIM enablement platform of the present disclosure provides a modeling platform for the building industry that can integrate design, engineering, construction, commissioning and operation.

Briefly, building information modeling (BIM) refers to a process of creating and managing digital or electronic representations of corresponding physical facilities or buildings. The BIM models are typically computer generated.

Industry Foundation Classes (IFC) is a current data model standard used in architecture design file, registered with ISO as ISO16739, and written in EXPRESS language. IFCXML is a schema of IFC in extensible markup language (XML) format (see http://buildingsmart-tech.org/ifcXML/IFC2x3/FINAL/IFC2X3.xsd).

Model View Definition (MVD), or an IFC View Definition, defines a subset of the IFC schema needed to satisfy one or many exchange requirements of the Architecture, Engineering & Construction (AEC) industry. MVD is a standard methodology and format documenting software implementation requirements for standard IFC based data exchange, adopted by the buildingSMART International in the spring of 2005. Information Delivery Manual, IDM (also ISO/DIS 29481) describes a method used and propagated by buildingSMART to define such exchange requirements (See, http://www.buildingsmart-tech.org/specifications/ifc-view-definition).

Model View Definition Template or MVDTemplate of the present disclosure in one embodiment, refers to a grouping of necessary data related to and needed for a specific instance of BIM format exchange/format translation using Model View Definition, which is also part of this data grouping. An example of a specific instance of BIM format exchange/format translation may be from IFC to energy simulation tool EnergyPlus format (.IDF) or from IFC to Airflows/Contaminant simulation tool CONTAM format (.PRJ).

BIMserver is a building information model server (BIMserver.org (blank spaces are added in the URL so that the text does not automatically convert to hypertext link). BIMserver currently supports IFC2x3 model with set of functions for querying and managing IFC elements, e.g., data model querying/merging, basic model validation, version control, basic access control via user authentication, and model translation to ifcXML, CoBIE, CityGML, Collada, and KML.

The FIG. 1 illustrates a BIM enablement platform of the present disclosure in one embodiment that enables a holistic and seamless workflow integration across a BIM life cycle, i.e., design, simulation, operations, and others, and files used by each of the phases of the BIM life cycle. A mechanism is disclosed to enable the development of a BIM enabling platform 102 that can host BIM data and metadata needed to integrate design, simulation, construction, and operation, etc. In one aspect, the BIM enabling platform of the present disclosure enables holistic and seamless workflow execution and provide data and metadata needed across the BIM life cycle spanning over diverse collection of design (e.g., 104), modeling, and simulation tools (e.g., 106), i.e., holistically manage the building information through life cycle and not just for a single phase, e.g., design or simulation, which the BIM related tools are supporting. In another aspect, the BIM enabling platform of the present disclosure encompasses BIM data and related metadata needed to perform BIM related tasks, e.g., format translation and BIM workflow execution from various BIM phases from design, simulation, to operations. This may include user, project, fine-grain role based and project based access control, file repositories, file format schemas, Model View Definition Templates, and any external information needed for performing the BIM tasks throughout the lifecycle of a building e.g., weather data, utility tariff, compliance, tax code, etc. Yet in another aspect, the BIM enabling platform of the present disclosure enables the creation of a modeling platform to support the hosting of BIM content and related metadata, file format schemas, Model View Definition Templates, etc., accessible all in one place and pulling data in from external sources; enables BIM format exchange from architectural design files to various simulation files, e.g., building simulations, e.g. energy, lighting, airflow, contaminant simulations, as well enabling the BIM workflow from design, simulation, construction, commissioning, and operation. Still in another aspect, the BIM enabling platform of the present disclosure enables applications/workflows that span one or more phases of the BIM lifecycle, e.g., BIM file format translations between various architectural design files and building simulation files. Further in another aspect, the BIM enabling platform of the present disclosure enables anywhere access to the building information model via the Internet. The BIM enablement platform 102 of the present disclosure may support BIM data access via either type of integration, e.g., loosely coupled or more tightly coupled, with existing external BIM file servers, e.g., BIMserver, for retrieving and processing file types supported, e.g., IFC and Collada, and data elements, e.g., IFC elements. Other different integration mechanisms for integrating with such external servers may exist.

The BIM enablement platform 102 of the present disclosure in one embodiment allows for storage and retrieval of standards based information exchanges of building data to support various workflow use cases including, but not limited to, building energy simulation (using EnergyPlus), building lighting simulation (e.g., using Radiance), and contaminants and indoor air quality simulation (e.g., using CONTAM) and other software platform via data interoperability framework. Example use cases include file format translation from the architecture design files to energy simulation files, from architecture design to contaminant simulation files, and from architecture design files to lighting simulation files. A data model is presented in one embodiment that enables the development and deployment of the data management services of the present disclosure on top of a database as defined using the data model discussed in the present disclosure for operations, e.g., version control of model updates, query of projects, and user management, and others to support the various data types of the sample workflows identified using software tools, e.g., EnergyPlus (energy simulation), Radiance (lighting simulation), and CONTAM (Contaminants simulation). The database definition in one embodiment of the present disclosure is created using a data definition language (DDL) of the data model. The data management services APIs are defined and can be implemented for accessing the data stored in the database. In addition, RESTful interfaces are defined and can be implemented to enable the data management services accessible over the World Wide Web ("Web"). Thus, data access is made possible over the Internet.

The following components in one embodiment of the present disclosure enable the end-to-end interoperability and workflows from building architecture design to various simulations such energy, lighting, airflow, or contaminant: BIM enablement platform architecture; Data model for enabling the interoperability workflow; Data schema described in data definition language (DDL) for defining and creating the table schema of a database; data management services/Application Programming Interfaces (APIs); RESTful interfaces based on the data management services/APIs; A system that comprises a user interface that communicates with users and uses the above components to provide functions/capabilities in at least the following areas, but not limited to: user management, project management, fine grained access control by project by role, repository management for various file formats, revision control of files in the repository, model verification, and application support to manage application related data and meta data, e.g., format translations, workflow execution, etc., including adding, retrieving, updating and deleting files in repository, file schemas, Model View Definition Templates, external information, as well as BIM Object query.

Figure 2:
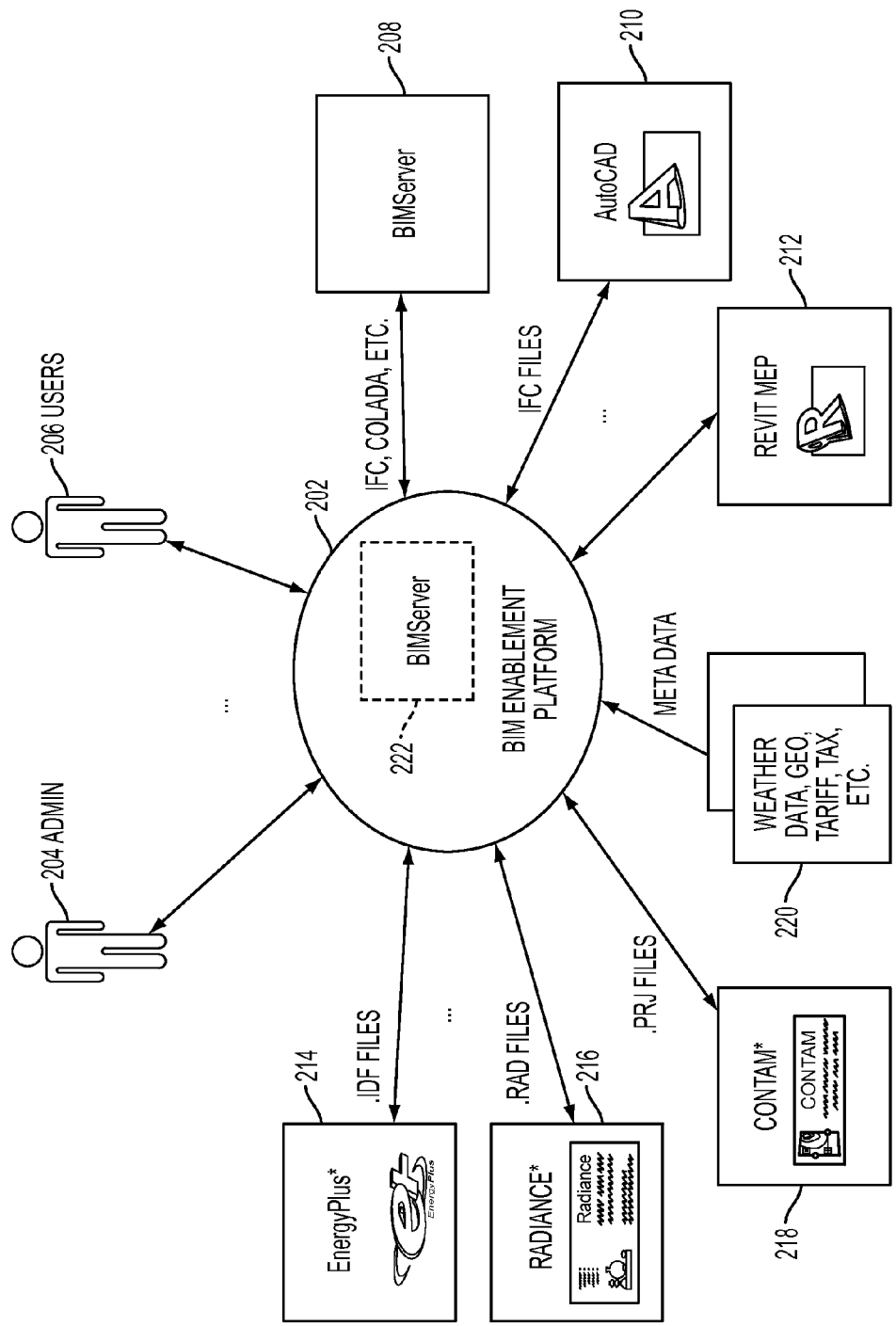
FIG. 2 shows a system context of a BIM enablement platform of the present disclosure in one embodiment.

FIG. 2 shows a system context of the BIM enablement platform of the present disclosure in one embodiment. The platform 202 enables both administrator 204 and users 206 to perform various BIM related tasks, e.g., formation translation from IFC format to CONTAM format (.PRJ) or from IFC to EnergyPlus (.IDF) format. Users 206 can have different roles, e.g., architect, engineer, owner, application developer, partner, guest, etc. In one embodiment, the access control assigned to users may be both role-based and project-based fine-grain access control. That is, a user can have a different role and receive a different access control list (ACL) for a different project. For example, a user Alex may be an architect in project A but a mechanical engineer in project B. Alex will be allowed to access only architectural related BIM elements/files for project A and mechanical related BIM elements/files for project B. This means each user receives different sets of ACLs to access different files/parts of the files in a project based on their role in the project.

The BIM Enablement platform 202 interacts with various external BIM related tools/platform to access files, e.g., file server 208, e.g., BIMServer (in a loosely coupled environment) or 222 (in a tightly coupled environment), and tools such as architecture design tools, e.g., AutoCAD 210 and Revit (from AutoDesk) 212, energy simulation tools, e.g., EnergyPlus 214, lighting simulation tools, e.g., Radiance 216, contaminant simulation tools such as COMTAM 218, and others. The BIM Enablement platform 202 may also receive metadata 220, e.g., related to weather data, geographical data, tariff and tax data, and others.

Figure 3:
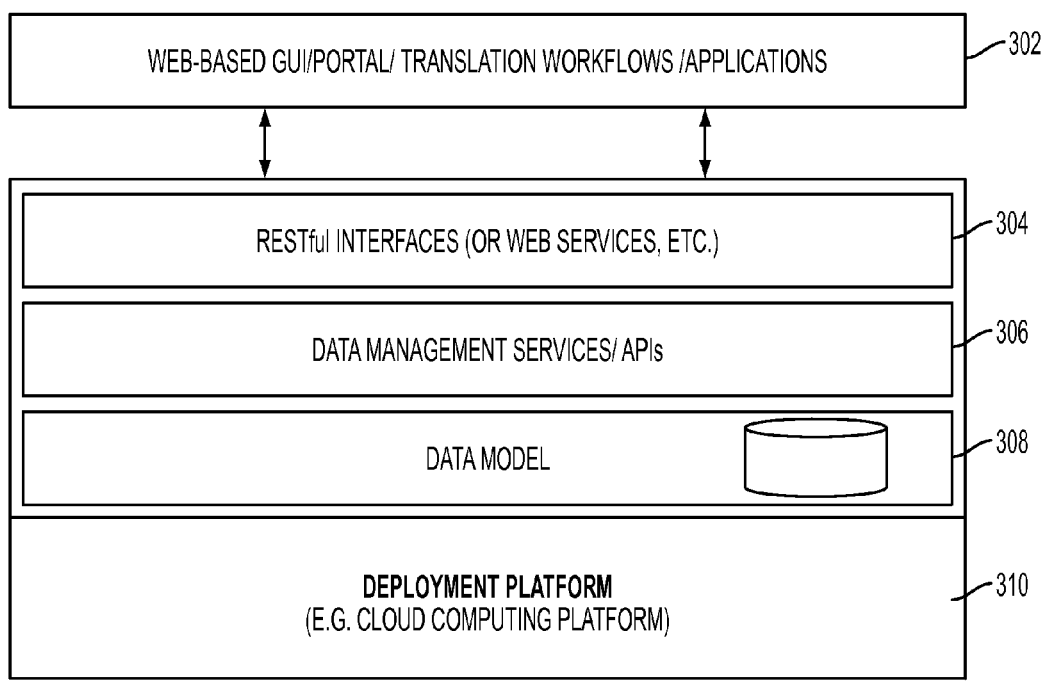
FIG. 3 illustrates architecture of a BIM enablement platform of the present disclosure in one embodiment.

FIG. 3 is a diagram showing a BIM enablement platform architecture in one embodiment of the present disclosure. A deployment platform 310 comprises hardware and middleware to enable the properly functioning of the BIM modeling enablement platform and the communication to the external computing entities, e.g. network nodes and computers, over a network such as the Internet. The following layers sit on top of the deployment platform 310 from top to bottom in one embodiment of the present disclosure: a Web-based portal 302, RESTful Interfaces (or Web services, etc.) 304, data management services and/or APIs 306, and a data model 308.

In one embodiment of the present disclosure, the Web-based portal 302 is created that enables a user to access the Building Information Modeling (BIM) enablement platform over the Internet. An example implementation is the Web portal 302, through which an administrator can perform user on-boarding tasks to create new users and manage the platform. As another example, the Web portal 302 may enable users to manage projects, create repositories/files, and submit jobs, e.g., running format translation workflow, e.g., from IFC file type to EnergyPlus file type or from IFC to CONTAM file type and simulation workflow, receive results, and store results back to the BIM enablement platform.

In layer 304, several types of connections can be enabled to access the BIM enablement platform, e.g.: RESTful APIs, Web service interface, and others, e.g., secure remote terminal. A set of RESTful interfaces may also be provided based on the data management services layer 306 below and enable those services to be accessible over the Web.

A set of data management services/application programming interfaces (APIs) 306 sit on top of the database/data schema 308. The services/APIs 306 may comprise functionalities such as version control of model updates, query of projects, and user management, and others. In one embodiment of the present disclosure, these data management services support a variety of data types for both architecture design files and the simulation files. Sample file types include EnergyPlus, Lighting (Radiance), and Contaminants (CONTAM). APIs are a set of specifications for use as an interface by software routes/components to communicate with each other to build software applications.

Data model/data base layer 308 sits below the layer of the data management services 306 and comprises the database schema that define the database tables for storing and retrieving of data stored in the database, e.g., using Structured Query Language (SQL) and/or an XML Query Language (Xquery) http://www.w3.org/TR/xquery/.

Figure 4:
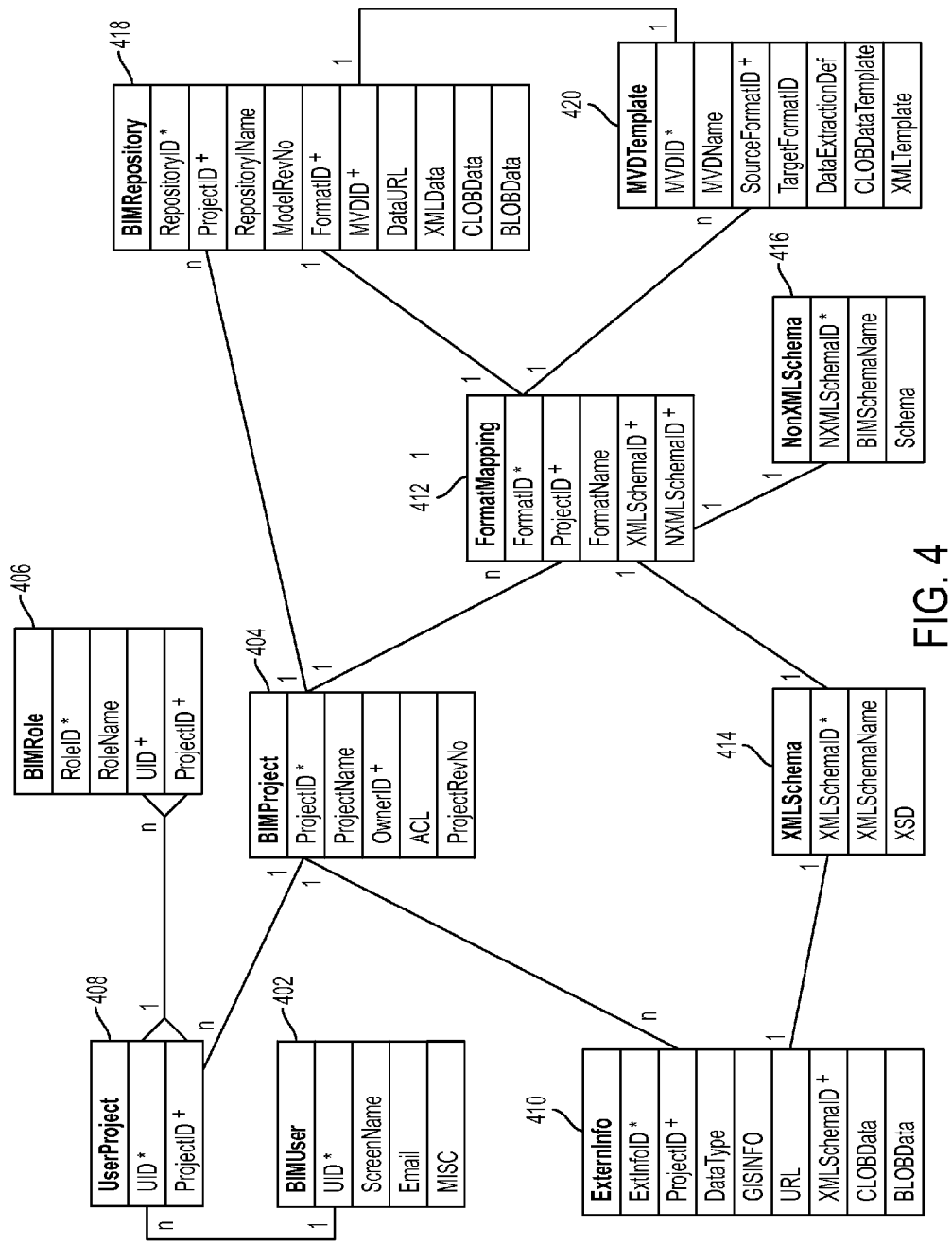
FIG. 4 shows a data model overview in one embodiment of the present disclosure.

FIG. 4 shows an overview of a data model in one embodiment of the present disclosure. The data model design in one embodiment of the present disclosure ensures performance, usability, and fine-grained project-based access control. The data model (also referred to as data model definitions) comprises data entities and entity relationships between the data entities.

Data Entities in one embodiment of the present disclosure include BIMUser 402, BIMProject 404, BIMRole 406, UserProject 408, ExternInfo 410, FormatMapping 412, XMLSchema 414, NonXMLSchema 416, MVDTemplate 420, and BIMRepository 418. Each data entity has a name of the entity, followed by the primary key of the entity, and the rest of the data fields of the entity. A detailed description of each data field is provided regarding what type of data is stored in the field and how it is used in the present disclosure. The primary keys or foreign keys used in relationships are also highlighted. For instance, example primary key for each data entity is annotated with '*' character; example foreign key is annotated with '+' character in the figure.

BIMUser data entity 402 defines a user known to the platform and contains basic information about the user. The user's password may be stored in a secure (e.g., Security) server and may not be duplicated here to avoid duplication and synchronization problems. UID(Integer) stores user ID of the user. ScreenName(VARCHAR) stores a display name for the user.

Figure 7:
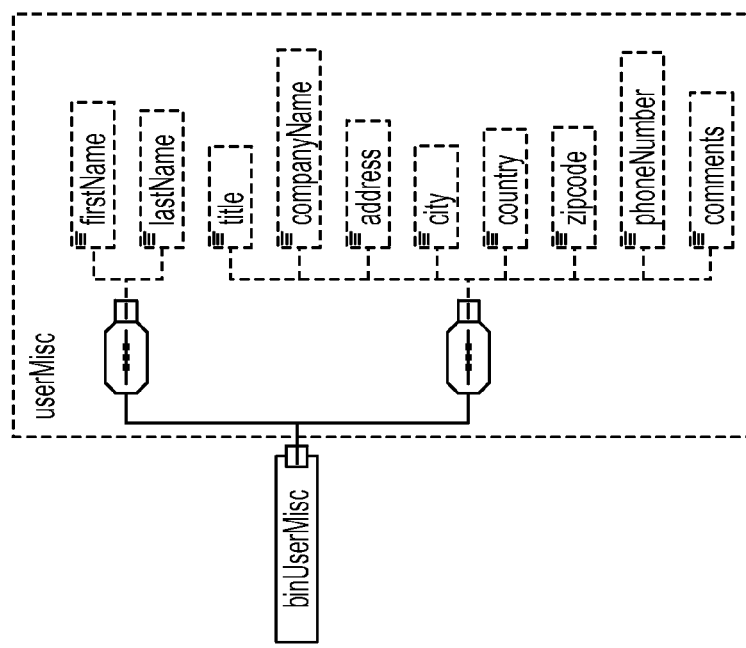
FIG. 7 shows an example of the MISC XML definition for miscellaneous personal information.

Email(VARCHAR) stores email of the user. MISC (XML) stores miscellaneous personal information, which can include but not limited to the following: First name, Last name, Title, Company name, Phone number, contact address, and comments. FIG. 7 shows an example of the MISC XML schema definition for miscellaneous personal information. Table 1 shows a sample instance of the XML.

TABLE 1

Sample XML instance:

```
<?xml version="1.0" encoding="UTF-8"?>
<!-- edited with XMLSPY v5 rel. 4 U (http://www.xmlspy.com) by IBM
User (IBM) -->
<!--Sample XML file generated by XMLSPY v5 rel. 4 U
(http://www.xmlspy.com)-->
<binUserMisc
xmlns:xsi="http://www.w3.org/2001/XMLSchema-instance"
xsi:noNamespaceSchemaLocation="C:\xsd xml\misc5.xsd">
    <firstName>Alex</firstName>
    <lastName>Smith</lastName>
    <title>Architect</title>
    <companyName>SeaCorp</companyName>
    <address>555 Main Street, Riverdale</address>
    <city>New York</city>
    <country>USA</country>
    <zipcode>10471</zipcode>
    <phoneNumber>718-555-1000</phoneNumber>
    <comments>BIM Data Hub partner</comments>
</binUserMisc>
```

Figure 8:
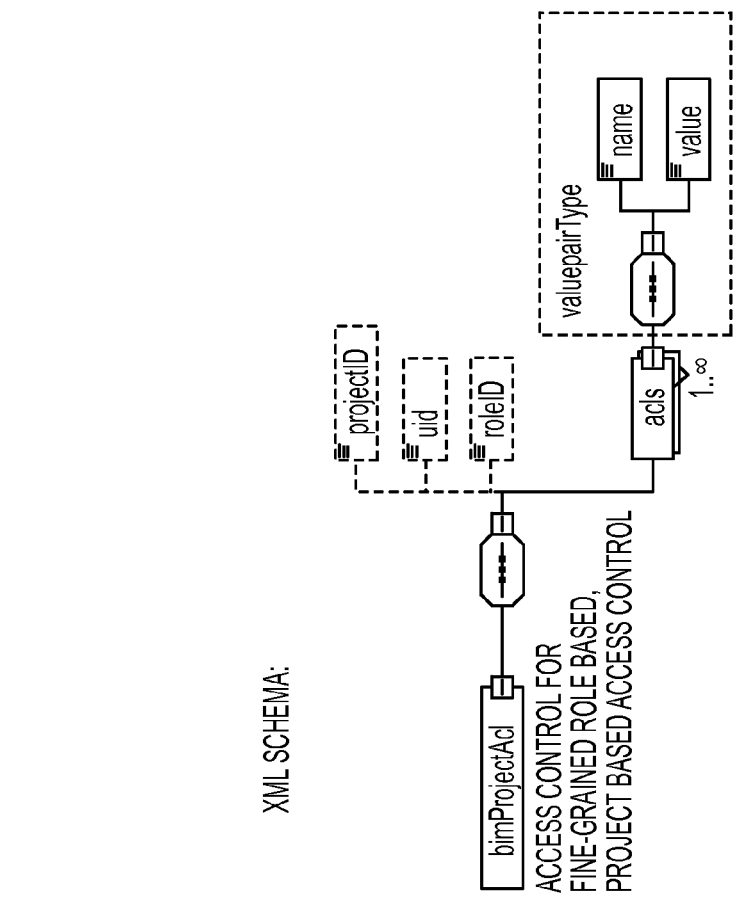
FIG. 8 shows an example of the Project ACL XML definition for project access control list.

Referring to FIG. 4, BIMProject data entity 404 defines a BIM project, project name, owner who created the project, fine-grained project-based access control list (ACL), such as by specific building element types, e.g., Building Objects, Model View Definitions, Mechanical models, etc., and project revision number. ProjectID (Integer) stores Project ID. ProjectName (VARCHAR) stores Project Name. OwnerID (VARCHAR) stores UID of the Project Owner. ACL (XML) stores or defines fine-grained project-based Access Control List definitions. FIG. 8 shows an example of the Project ACL XML schema definition for project access control list. Table 2 shows a sample instance of the XML. An authorized user is allowed access based on their role and access is further defined by element types in the project, e.g., building objects, Model View Definitions, mechanical or electrical models, etc. ProjRevNo (Integer) stores a project revision number.

TABLE 2

Sample XML:

```
<?xml version="1.0" encoding="UTF-8"?>
<!-- edited with XMLSPY v5 rel. 4 U (http://www.xmlspy.com) by IBM
User (IBM) -->
<!--Sample XML file generated by XMLSPY v5 rel. 4 U
(http://www.xmlspy.com)-->
<bimProjectAcl
xmlns:xsi="http://www.w3.org/2001/XMLSchema-instance"
xsi:noNamespaceSchemaLocation="C:\xsd xml\acl3.xsd">
    <projectID>80032</projectID>
    <uid>23155</uid>
    <roleID>5</roleID>
    <acls>
        <name>read</name>
        <value>architectural elements</value>
    </acls>
    <acls>
        <name>update</name>
        <value>mechanical, electrical elements</value>
    </acls>
    <acls>
        <name>delete</name>
        <value>mechanical, electrical, plumbing elements</value>
    </acls>
</bimProjectAcl>
```

The BIMRole data entity 406 defines a user's role in each project, to which a user belongs. This entity 406 specifies a role-based project-based fine-grained access control of the data in the Hub. That is, a user can have different roles and receive different access control for a different project. For example, user Alex may be an architect in project A but a mechanical engineer in project B. Alex receives different sets of ACL based on his role in the project. RoleID (Integer) stores a role identifier. RoleName(VARCHAR) stores a role name, e.g., architect, mechanical engineer, electrical engineer, etc. UID(Integer) stores user identifier of the user. ProjectID (Integer) stores a project identifier this role is defined for.

This UserProject data entity 408 links to both BIMUser 402 and BIMProject 404 data entities to form relationships, which identify many to many relationships between the two data entities. That is, one user can be the owner/creator of multiple projects, and one project can have multiple users. UID(Integer) stores a user ID of the user. ProjectID (Integer) stores a project ID.

The ExternInfo data entity 410 stores any external information related to the project that may be needed to enable the format translation workflow from various BIM phases from design, simulation, to operations. ExtInfoID (Integer) stores an ID of the external information. ProjectID (Integer) stores a project ID. DataType (VARCHAR) stores auxiliary data type description, e.g., weather data, utility tariff, tax code, and any operational data, etc. GISINFO (DB2 GIS Extension) stores locality information to enable location-based query. URL (VARCHAR) stores uniform resource locator (URL) link that points to the information source. XMLSchemaID (Integer)

stores extensible markup language (XML) Schema ID to link an XMLSchema table to locate a XML schema stored in the XML schema definition (XSD) field for Model Validation. CLOB Data (CLOB) store Document Based Auxiliary Data such as TMY2, TMY3, CSV Formatted NOAA Data, and others. BLOB Data (BLOB) stores Binary Data.

FormatMapping data entity 412 stores information used in format mapping. FormatID (Integer) stores a format ID. ProjectID (Integer) stores a project ID. FormatName (VARCHAR) stores name of file format, e.g., IFCXML, gbXML, and others (non-xml, e.g., IFC). XMLSchemaID(Integer) stores a link to an entry in the XMLSchema table to locate the XML schema stored in the XSD field for Model Validation. NXMLSchemaID (Integer) stores a link to an entry in the NonXMLSchema table to locate the schema stored in the Schema field for Model Validation.

XMLSchema data entity 414 stores data related to XML Schema. XMLSchemaID (Integer) stores XML Schema ID. XMLSchemaName (VARCHAR) stores an XML Schema Name (e.g., IFCXML 2×3, gbXML). XSD (XSD) stores XML Schema XSD for On-line model validation.

NonXMLSchema data entity 416 stores data related to non-XML Schema. NXMLSchemaID(Integer) stores a non-XML Schema ID. BIMSchemaName(VARCHAR) stores BIM non-XML Schema Name (e.g. IFC). Schema (CLOB) stores document based schema for Model validation, e.g., IFC.

BIMRepository data entity 418 is used to store all kinds of data related to files. An instance of BIMRepository can contain an input file for the format translation or an output file of a building simulation, e.g., energy, lighting, airflow, or contaminant simulation. If the file is used for the format translation, the BIMRepository instance can point to a FormatMapping instance for the data format and point to an MVDTemplate instance that stores the information of a Model View Definition to be used for the format translation.

In one embodiment of the present disclosure, depending on whether the data is stored locally in the BIMRepository or remotely on a file repository, only one out of the four data fields is valid for a BIMRepository instance. That is, if the data is to be stored remotely from an external file server like BIMServer, the data should be specified as a URL link in the DataURL field to link to the data source. If the data is stored locally in the BIM enablement platform, depending on the actual data type, e.g., XML IFC, or binary data, one of the three data fields can be used: XMLData, CLOBData, or BLOBData.

RepositoryID (Integer) stores an ID of the repository. ProjectID(Integer) stores a project ID. RepositoryName(VARCHAR) stores a repository name. ModelRevNo(Integer) stores a model revision number. FormatID(Integer) stores BIM format, e.g., a pointer to a format mapping table that contains data of the exchange format (both xml and non-XML). Examples values of FormatID field may include 1—IFCXML, 2—gbXML, 3—IFC, 4—(other . . . ). MVDID (Integer) stores an identifier that identifies an instance of MVDTemplate to be used for format translation by the file stored in the BIM repository. DataURL(VARCHAR) stores a URL link to file/data stored in other file repository server, e.g., BIMServer.org. XMLData(XML) stores XML based Building Information Model such IFCXML and gbXML. CLOBData (CLOB) stores document-based BIM such as COLLADA, IFC. BLOBData(BLOB) stores binary data such as AutoCAD™ Revit models.

MVDTemplate data entity 420 stores data about an instance of Model View Definition to be used by the files/data stored in the BIMRepository for format translation. MVDID (Integer) stores a Model View Definition ID. MVDName (VARCHAR) stores Model View Definition Names, e.g., 'EnergyPlus Model View,' 'CONTAM Model View', etc. SourceFormatID(Integer) stores a pointer to a source format mapping table that contains the data format of the source file (both xml and non-XML) of the format translation. TargetFormatID(Integer) stores a pointer to a target format mapping table that contains the exchange format of the target file (both xml and non-XML) of the format translation. DataExtractionDef(XML) stores XML definition of how data is to be extracted from the source files, e.g., get data elements from a file repository server (e.g., get IFC data elements from the BIMServer); using parser and Java™ APIs; using an ordered list of SQL Queries and X Queries from the file stored in an instance of BIMRepository. CLOBDataTemplate(CLOB) stores character based Model View Definition instance data. XMLTemplate(XML) stores an XML based Model View Definition instance data, e.g., a list of IFCXML objects, names, and queries for a specific Model View Definition. XMLTemplate(XML) field also stores default values for incomplete BIM for a specific model view (e.g., default R value for an unspecified window).

Details each of the twelve entity relationships in one embodiment of the present disclosure are described below. As described in the Table 3, for each relationship, the source entity, destination data entity, the multiplicity of the source data entity and destination data entity, and the key(s) used for connecting the two data entities in the relationship are specified. The number in the Relationship column is arbitrary used only for the purpose of identification of an individual relationship.

TABLE 3

Relationships between the Data Entities.

| Relationship | Source Data Entity | Destination Data Entity | Multiplicity | Key used |
| --- | --- | --- | --- | --- |
| 1. | BIMUser | UserProject | 1 . . . N | UID |
| 2. | BIMProject | UserProject | 1 . . . N | ProjectID |
| 3. | UserProject | BIMRole | 1 . . . N | UID, ProjectID |
| 4. | BIMProject | ExternInfo | 1 . . . N | ProjectID |
| 5. | BIMProject | FormatMapping | 1 . . . N | ProjectID |
| 6. | BIMProject | BIMRepository | 1 . . . N | ProjectID |
| 7. | FormatMapping | XMLSchema | 1 . . . 1 | XMLSchemaID |
| 8 | FormatMapping | NonXMLSchema | 1 . . . 1 | NXMLSchemaID |
| 9. | FormatMapping | MVDTemplate | 1 . . . N | SourceFormatID |
| 10. | BIMRepository | FormatMapping | 1 . . . 1 | FormatID |
| 11. | BIMRepository | MVDTemplate | 1 . . . 1 | MVDID |
| 12. | ExternInfo | XMLSchema | 1 . . . 1 | XMLSchemaID |

The following describes example usage scenario/workflows using the above descried data model. One example of a usage scenario may be translating of design file (in IFC) format to contaminant simulation file (.PRJ):

1. An administrator may create a user, e.g., via the BIM enabling platform of the present disclosure, creating an instance of the BIMUser data entity and populating the fields. For example, the fields may be populated as follows:

UID: 1124
ScreenName: Alex
Email: alex @ yahoo.com
Misc: Alex Smith, 2, 1150 Main St. Philadelphia, Pa.

2. A user may also create a project, e.g., by creating an instance of the BIMProject data entity, and/or add to an existing one, and add a project role in BIMRole data entity instance. For example, the fields of the BIMProject instance may be populated as follows:

ProjectID: 8001
ProjectName:CONTAMSimulationProject
OwnerID: 1124
ACL: "Architect—Read/Write/Update by Building Objects, Model View Definitions; Mechanical Engineers—Read/Write/Update Mechanical models, Read—architectural design, Model View Definitions"
ProjectRevNo: 1

The fields of the BIMRole instance may be populated as follows:

RoleID: 1
RoleName: Architect
UID: 1124
ProjectID: 8001

3. A user may further add one or more external information such as weather data for multiple simulation runs, utility tariff, tax code, and other information by creating or adding to an instance of the ExternInfo data entity. For example, the fields of the ExternInfo instance may be populated as follows:

ExtInfoID: 6001
ProjectID: 8001
DataType: weather data
GISINFO: geographic information system (GIS) coordinates of Philadelphia, Pa.
URL: http://www.underground.com (blank spaces are inserted in the URL so that the text does not convert automatically to a hypertext link)
XMLSchemaID: null
CLOBData: null
BLOBData: null 4. A user may also create and/or link to a file format and schema, e.g., IFC, for instance, by creating or adding to instances of the FormatMapping data entity and NonXMLSchema data entity. For example, the fields of the FormatMapping instance may be populated as follows:

FomatID: 5001
ProjectID: 8001
FormatName: "IFC Format"
XMLSchemaID: null
NXMLSchemaID: 4001

The fields of the NonXMLSchema instance may be populated as follows for example:

NXMLSchemaID: 4001
BIMSchemaName: IFCSchema
Schema: (IFCschema content)

5. A user may also create an instance of MVDTemplate or use an existing one for IFC to CONTAM format translating, e.g., by creating a new or using an existing instance of the MVDTemplate data entity. For example, the fields of the MVDTemplate instance may be populated as follows:

MVDID: 9001
MVDName: IFC to CONTAM MVDTemplate
SourceFormatID: 5001
TargetFormatID: 5002
DataExtractionDef: (data extraction def)
clobdataTemplate: (cdata template)
XMLTemplate: null 6. A user may further create an input file by creating an instance of the BIMRepository data entity, e.g., in which a URL points to BIMServer.org and an MVDTemplate instance. For example, the fields of the BIMRepository instance may be populated as follows:

RepositoryID: 7001
ProjectID: 8001
RepositoryName: "BIMserver Repository"
ModelRevNo: 1
FomatID: 5001
MVDID: 9001
DataURL: bimserver.org/xxx/xxx
XMLData: null
CLOBData: null
BLOBData: null 7. A user may also run the code using an input file specified in the ExternInfo instance, extract IFC elements from BIMServer.org, and transform using the MVDTemplate instance to produce an output CONTAM file.

8. A user may add the output file to the Repository.

9. A user further may repeat the above items 3-8 for a different input file.

Another example of a usage scenario may be translating of design file (in IFCXML) format to energy simulation file (.IDF). The following may be performed via the BIM enabling platform and the data model of the present disclosure described above.

1. An administrator may create a user if not previously defined, e.g., via the BIM enabling platform of the present disclosure, creating an instance of the BIMUser data entity and populating the fields. For example, the fields may be populated as follows:

UID: 1125
ScreenName: Dave
Email: dave @ yahoo.com
Misc: Dave Black, 2, "4450 Lexington St. Philadelphia, Pa."

2. A user may also create a project, e.g., by creating an instance of the BIMProject data entity, and/or add to an existing one, and add a project role in BIMRole data entity instance. For example, the fields of the BIMProject instance may be populated as follows:

ProjectID: 8002
ProjectName: "EnergyPlusSimulationProject"
OwnerID: 1125
ACL: "Architect—Read/Write/Update by Building Objects, Model View Definitions; Mechanical Engineers—Read/Write/Update Mechanical models, Read—architectural design, Model View Definitions"
ProjectRevNo: 1

The fields of the BIMRole instance may be populated as follows:

RoleID: 2
RoleName: Electrical Engineer
UID: 1125
ProjectID: 8002

3. A user may further add one or more external information such as weather data for multiple simulation runs, utility tariff, tax code, and other information by creating or adding to an instance of the ExternInfo data entity. For example, the fields of the ExternInfo instance may be populated as follows:
ExtInfoID: 6002
ProjectID: 8002
DataType: weather data
GISINFO: geographic information system (GIS) coordinates of Harrisburg, Pa.
URL: http://weather.gov
XMLSchemaID: null
CLOBData: null
BLOBData: null 4. A user may also create and/or link to a file format and schema, e.g., IFC, for instance, by creating or adding to instances of the FormatMapping data entity and XMLSchema data entity. For example, the fields of the FormatMapping instance may be populated as follows:
FomatID: 5003
ProjectID: 8002
FormatName: "IFC XML Format"
XMLSchemaID: null
NXMLSchemaID: 3001

The fields of the XMLSchema instance may be populated as follows for example:
NXMLSchemaID: 3001
BIMSchemaName: IFC XML Schema
Schema: (IFC schema content)

5. A user may also create an instance of MVDTemplate or use an existing one for IFCXML to IDF format translating, e.g., by creating a new or using an existing instance of the MVDTemplate data entity. For example, the fields of the MVDTemplate instance may be populated as follows:
MVDID: 9002
MVDName: IFC to EnergyPlus MVDTemplate
SourceFormatID: 5003
TargetFormatID: 5004
DataExtractionDef: (data extraction def in XML)
clobdataTemplate: null
XMLTemplate: (XML template)

6. A user may further create an input XML file stored in the repository by creating an instance of the BIMRepository data entity. For example, the fields of the BIMRepository instance may be populated as follows:
RepositoryID: 7002
ProjectID: 8002
RepositoryName: "IFCXML Repository"
ModelRevNo: 1
FomatID: 5003
MVDID: 9002
DataURL: null
XMLData: (xml data content)
CLOBData: null
BLOBData: null 7. A user may also run the code using an input file specified in the ExternInfo instance, parse IFC elements to extract data, and transform using the MVDTemplate instance to produce an output .IDF EP file.

8. A user may add the output file to the Repository.

9. A user further may repeat the above items 3-8 for a different input file.

Yet another example of a usage scenario may be translating file formats, IFC to Radiance. There may be two ways to do the format translation to Radiance (.RAD file):

1. Translate IFC to a Radiance file directly. This approach is similar to the IFC to EnergyPlus translation outlined above with modifications to items 5 to 7.

2. Translate IFC to EnergyPlus as outlined in the above described usage scenario, and then to a Radiance file.

The following describes a data definition language (DDL) of the present disclosure in one embodiment defining the table schema of a database.

Data Schema (Data definition language or DDL)

```
CREATE TABLE "DB2INST1"."BIMUSER"
(
    UID INTEGER GENERATED ALWAYS AS IDENTITY PRIMARY KEY NOT NULL,
    SCREENNAME VARCHAR (50),
    EMAIL VARCHAR (100),
    MISC XML
);
CREATE TABLE "DB2INST1"."BIMROLE"
(
    ROLEID INTEGER GENERATED ALWAYS AS IDENTITY PRIMARY KEY NOT NULL
        (START WITH 1, INCREMENT BY 1, NO CACHE),
    ROLENAME VARCHAR (100),
    UID INTEGER NOT NULL,
    PROJECTID INTEGER NOT NULL
);
CREATE TABLE DB2INST1.BIMPROJECT
(
    PROJECTID INTEGER GENERATED ALWAYS AS IDENTITY PRIMARY KEY NOT NULL
        (START WITH 20000, INCREMENT BY 1, NO CACHE),
    PROJECTNAME VARCHAR (100),
    OWNERID INTEGER NOT NULL ,
    ACL XML NOT NULL,
    PROJREVNO INTEGER
);
CREATE TABLE "DB2INST1"."USERPROJECT"
(
    UID INTEGER NOT NULL PRIMARY KEY,
    PROJECTID INTEGER NOT NULL
);
CREATE TABLE "DB2INST1"."BIMREPOSITORY"
(
    REPOSITORYID INTEGER GENERATED ALWAYS AS IDENTITY PRIMARY KEY NOT NULL
        (START WITH 30000, INCREMENT BY 1, NO CACHE),
    REPOSITORY VARCHAR (200),
    PROJECTID INTEGER NOT NULL ,
    MODELREVNO INTEGER ,
    FORMATID INTEGER ,
    MVDID INTEGER ,
    DATAURL VARCHAR (200),
    XMLDATA XML ,
    CLOBDATA CLOB ,
    BLOBDATA CLOB
);
CREATE TABLE "DB2INST1"."EXTERNINFO"
(
    EXTINFOID INTEGER GENERATED ALWAYS AS IDENTITY PRIMARY KEY NOT NULL
        (START WITH 1, INCREMENT BY 1, NO CACHE),
    PROJECTED INTEGER NOT NULL ,
    DATATYPE VARCHAR(100),
    GISINFO DB2GSE.ST_POINT ,
    URL VARCHAR(200),
    XMLSCHEMAID INTEGER ,
    CLOBDATA CLOB ,
    BLOBDATA CLOB
);
CREATE TABLE "DB2INST1"."MODELVIEWTEMPLATE"
(
    MVDID INTEGER GENERATED ALWAYS AS IDENTITY PRIMARY KEY NOT NULL
        (START WITH 40000, INCREMENT BY 1, NO CACHE),
    MVDNAME VARCHAR (100),
    SOURCEFORMATID INTEGER NOT NULL,
    TARGETFORMATID INTEGER NOT NULL,
    DATAEXTRACTIONDEF XML ,
    CLOBDATATEMPLATE CLOB,
    XMLTEMPLATE XML
);
CREATE TABLE "DB2INST1"."FORMATMAPPING"
(
    FORMATID INTEGER GENERATED ALWAYS AS IDENTITY
```

Data Schema (Data definition language or DDL)

```
PRIMARY KEY NOT NULL
    (START WITH 1, INCREMENT BY 1, NO CACHE),
    PROJECTED INTEGER NOT NULL ,
    FORMATNAME VARCHAR (100) ,
    XMLSCHEMAID INTEGER ,
    NXMLSCHEMAID INTEGER
);
CREATE TABLE "DB2INST1"."XMLSCHEMA"
(
    XMLSCHEMAID INTEGER GENERATED ALWAYS AS
IDENTITY PRIMARY KEY NOT NULL
    (START WITH 1, INCREMENT BY 1, NO CACHE),
    XMLSCHEMANAME VARCHAR(100) ,
    XSD XML
);
CREATE TABLE "DB2INST1"."NONXMLSCHEMA"
(
    NXMLSCHEMAID INTEGER GENERATED ALWAYS AS
IDENTITY PRIMARY KEY NOT NULL
    (START WITH 1, INCREMENT BY 1, NO CACHE),
    BIMSCHEMANAME VARCHAR(100) ,
    SCHEMA CLOB
);
```

The following describes data management services (application programming interfaces or APIs) in one embodiment of the present disclosure. The functions are shown as example of those that enable interactions with one or more of the data entities; this is not an exclusive list of APIs. The methodologies of the present disclosure, however, are not limited to only those functions.

The APIs may include functions that Add/Get/Update/Delete a data entity, e.g. BIMUser, BIMRole, BIMProject, BIMRepository, ACL, FormatMapping, ExternInfo, MVDTemplate, XMLSchema, NonXMLSchema, etc.

```
// Add a BIMUser
// Return: BIMUser object or null if failure
// BIMUser object provides getter and setter APIs for each data field
// Constructors
// UID will be assigned automatically when a user is added to DB
successfully
public BIMUser(String screenName, String email, SQLXML misc);
public BIMUser(int uid, String screenName, String email, SQLXML
misc);
/* Add a BIMUser to database
* Input: screenName cannot be null. Email and misc can be null.
   Return: BIMUser object or null if failure, e.g. if screenName is null.
   BIMUser object provides getter and setter APIs for each data field
*/
public BIMUser addUser( ) ;
// Get the BIMUser data object/record for the user by the
screenName
BIMUser getUserByName(String screenName);
// Update a BIMUser info
BIMUser updtBIMUser(BIMUser updtUser);
// Delete a BIMuser
// return code: 0 - success; non-zero failure (see below)
// -1 - not found;
int deleteUser(int uid);
int deleteUserByName(String screenName);
```

BIMProject APIs may include functions that Add/Get/Update/Delete

```
// Add a BIMProject
// Return: BIMProject object or null if failure
// BIMProject object provides getter and setter APIs for each data field
BIMProject addBIMProject(String ProjectName, OwnerID, ACL,
ProjectRevNo);
// Get a BIMroject data object by the project Name
BIMProject getProjectByName(String projectName);
// Update a BIMProject info
BIMProject updtBIMProject(BIMProject updtProject);
// Delete a BIMProject
// Deletion of a project also remove all the relationships the project has
with other data entities.
// return code: 0 - success; non-zero failure (see below)
// -1 - not found;
integer deleteProjectByName(String projectName);
// Get a list of users authorized for a project
BIMUser[ ] getAllUsersByProject(String projectName);
// Get a list of projects a user has created
BIMProject[ ] getAllProjectsByUser(String screenName);
```

The following describe BIMRole APIs.

```
// Add a BIMRole for a project
// Return: BIMRole object or null if failure
// BIMRole object provides getter and setter APIs for each data field
BIMRole addBIMRole(RoleName, UID, ProjectID);
// Get a BIMRole by the Role Name
BIMRole getRoleByName(String RoleName);
// Update a BIMRole info
BIMRole updtBIMRole(BIMRole updtRole);
// Delete a BIMRole
// return code: 0 - success; non-zero failure (see below)
// -1 - not found;
integer deleteRoleByName(String RoleName, integer projectID);
```

ACL APIs may include the following for role and Project based ACLs.

```
// Get a user's ACLs for a project
// input: either screenName or projectName can be null
//    If the screenName is null, returns all projects and roles the user has
//    If the projectName is null, returns all user and role pair for each
     project
// returns an ACL structure, which has two fields:
// String projectName
// String roleName
// XML xmlACL
ACL[ ] getUserProjectACL(String screenName, String projectName);
```

The following describes ExternInfo APIs by project.

```
// Add an ExternInfo entry for the project
// Input: either CLOB or BLOB is empty
// Return: ExternInfo object or null if failure
// ExternInfo object provides getter and setter APIs for each data field
ExternInfo addExternInfo (integer ProjectID, String DataType, GIS
GISINFO, String URL, integer XMLSchemaID, CLOB CLOBData,
BLOB BLOBData)
// Get an ExternInfo data objects by the project Name
ExternInfo getExternInfoByProject(String projectName);
// Update an ExternInfo info
ExternInfo updtExternInfo (ExternInfo updtExternInfo);
// Delete an ExternInfo
// return code: 0 - success; non-zero failure (see below)
// -1 - not found;
integer deleteExternInfoByProject(String projectName, integer
ExternInfoID);
// Get all ExternInfo related to a project
ExternInfo[ ] getAllExternInfoByProject(String projectName);
```

The following describes BIMRepository APIs.

```
// Add an IFC model to a BIMRepository
// Return: BIMRepository object or null if failure
```

```
// BIMRepository object provides getter and setter APIs for each data field
BIMRepository addFiletoBIMRepository(String repositoryName, int
projectID, integer formatID, integer MVDID, String DataURL, xml
XMLData, CLOB CLOBData, BLOB BLOBData);
// Get the BIMRepository data objects by Name
BIMRepository getRepositoryByName(String repositoryName);
// Get all BIMRepository instances related to a project
BIMRepository[ ] getAllRepositoriesByProject(String projectName);
//Update a Repository info
BIMRepository updtBIMRepository(BIMRepository updtRepository);
// Delete BIMRepository
// return code: 0 - success; non-zero failure (see below);
// −1 - not found;
integer deleteBIMRepositoryByName(String BIMRepositoryName, integer
projectID);
```

The following describes FormatMapping APIs.

```
// Add a FormatMapping
// Return: FormatMapping object or null if failure
// FormatMapping object provides getter and setter APIs for each data field
FormatMapping addFormatMapping(integer ProjectID, String
FormatName, integerXMLSchemaID, integer NXMLSchemaID);
// Get a FormatMapping data objects by Name and by project
FormatMapping getFormatMappingByName(String projectName,
String formatName);
// Get all FormatMapping related to a project
FormatMapping[ ] getAllFormatMappingByProject(String projectName);
//Update a FormatMapping info
FormatMapping updtFormatMapping(FormatMapping
updtFormatMapping);
// Delete a FormatMapping by Name by project
// return code: 0 - success; non-zero failure (see below)
// −1 - not found;
integer deleteFormatMappingByName((String projectName, String
formatName);
```

The following describes MVDTemplate APIs.

```
// Add a MVDTemplate
// Return: MVDTemplate object or null if failure
// MVDTemplate object provides getter and setter APIs for each data field
MVDTemplate addMVDTemplate(String MVDName, integer
SourceFormatID, integer TargetFormatID, xml DataExtractionDef, clob
clobdataTemplate, xml XMLTemplate);
// Get a MVDTemplate data object by Name
MVDTemplate getMVDTemplateByName(String mvdName);
// Update a MVDTemplate info
MVDTemplate updtMVDTemplate(MVDTemplate updtMVDTemplate);
// Delete a MVDTemplate
// Deletion of a project also remove all the relationships the project has
with other data entities.
// return code: 0 - success; non-zero failure (see below)
// −1 - not found;
integer deleteMVDTemplateByName(String mvdName);
// Get a MVDTemplate instance used by the repository
MVDTemplate getMVDByRepository(integer repositoryID);
// Get all MVDTemplate instances related to a source Format, e.g. IFC
MVDTemplate[ ] getAllMVDsBySourceFormat(String formatName);
```

The following describes Format translation APIs

```
// Invoke a model translation from IFC to PRJ, IDF, RAD
//input params: e.g. source/target - IFC / PRJ, IFC / IDF, IFC / RAD
//output: BIMModel[ ] or null if failure
BIMModel[ ] translateIFCtoPRJ(String sourceType, String targetType,
int RepositoryID);
```

The following describes XMLSchema APIs

```
// Add an XMLSchema
// Return: XMLSchema object or null if failure
// XMLSchema object provides getter and setter APIs for each data field
XMLSchema addXMLSchema(String XMLSchemaName,cdata xsd);
// Get an XMLSchema
XMLSchema getXMLSchemaByName(String XMLSchemaName);
// Update an XMLSchema
XMLSchema updtXMLSchema(cdata updtXMLSchema);
// Delete an XMLSchema
// Deletion of a project also remove all the relationships the project has
with other data entities.
// return code: 0 - success; non-zero failure (see below)
// −1 - not found;
integer deleteXMLSchemaByName(String xmlSchemaName);
```

The following describes None XMLSchema APIs

```
// Add a NonXMLSchema
// Return: NonXMLSchema object or null if failure
// NonXMLSchema object provides getter and setter APIs for each data
field
NonXMLSchema addNonXMLSchema(String BIMSchemaName, CLOB
schema);
// get the NonXMLSchema data object by the Name
NonXMLSchema getNonXMLSchemaByName(String BIMSchemaName);
// Update NonXMLSchema info
NonXMLSchema updtNonXMLSchema(NonXMLSchema
updtNonXMLSchema);
// Delete a NonXMLSchema
// Deletion of a project also remove all the relationships the project has
with other data entities.
// return code: 0 - success; non-zero failure (see below)
// −1 - not found;
integer deleteNonXMLSchemaByName(String BIMSchemaName);
```

The following describes BIM Object query APIs

```
// Selectively query BIM Object
BIMObject[ ] getAllWalls(int RepositoryID);
BIMObject[ ] getAllFloorplans(int RepositoryID);
BIMObject[ ] getAllFenetrationSurfaces(int RepositoryID);
BIMObject[ ] getAllMechanicalSystems(int RepositoryID);
BIMObject[ ] getAllElectricalSystems(int RepositoryID);
BIMObject[ ] getAllRoof(int RepositoryID);
BIMObject[ ] getAllStructuralDesign(int RepositoryID);
```

The following describes model verification APIs

```
// Model verification
ValidationResults[ ] clashDetection(int BIMRepositoryID);
```

The following describes revision control APIs

```
// Get repository revision number
revNo getRevNumber(int RepositoryID);
```

RESTful interfaces are described as follows. A subset of the above data management services/APIs are exposed as RESTful interfaces, which enables the data management services/APIs to be accessible over the Web. The definition of the RESTful interfaces is provided in http://www.ibm.com/developerworks/webservices/library/ws-restful/

Example RESTful Interfaces may include:

```
// Add a BIMUser
Method: PUT HTTP/1.1
API Path: /addBIMUser?ScreenName= & Email= & MISC=
```

```
HTTP Response:
201: Successfully Created
400: Bad Request
// Get a BIMUser data object/record for the user by the screenName
Method: GET HTTP/1.1
API Path: /getUserByName?screenName=
HTTP Response:
200: Success (with Returned User Names)
400: Bad Request
// Update the BIMUser data object/record for the user by the screenName
Method: PUT HTTP/1.1
API Path:/updtBIMUser?updtUser=
HTTP Response:
201: Successfully Created
400: Bad Request
// Delete user
Method: GET HTTP/1.1
API Path: /deleteUserByName?screenName=
HTTP Response:
200: Success (with Returned User Names)
400: Bad Request
```

A system of the present disclosure may further comprise a user interface that communicates with users and uses the above-described components to provide functions and/or services to users to perform work related to BIM, e.g., formation translation, BIM workflow execution, and others. A portal may comprise a user interface/portal that enable all or part of the following functions provided by the data management services/APIs to manipulate those data entities (add/get/update/delete) and get data based on the relationships between the data entities. Some of the GUI/portal functions may include at least the following five areas or more: User Management; Use BIMUser related APIs; Fine-grained Access control such as using BIMRole, BIMUser, BIMProject related APIs and assigning project-based, role-based access (ACL); Project Management, for instance, using BIMProject, BIMRepository, ExternInfo related APIs and adding externInfo for the project; Repository Management (for Project) such as using BIMProject, BIMUser, BIMRole, BIMRepository, ExternInfo related APIs, creating Repository instances for the project, revision control for the Repository instances, model verification for the Repository instances; and Application support (e.g., Format translations for Projects, workflow execution), including managing schema and Model View Definition Template, using XMLSchema, NonXMLSchema, FormatMapping, MVDTemplate, ExternInfo related APIs, specifying the schema, and Model View Definition Template for the Repository, and querying BIM Objects for Format translation, etc.

Figure 5:
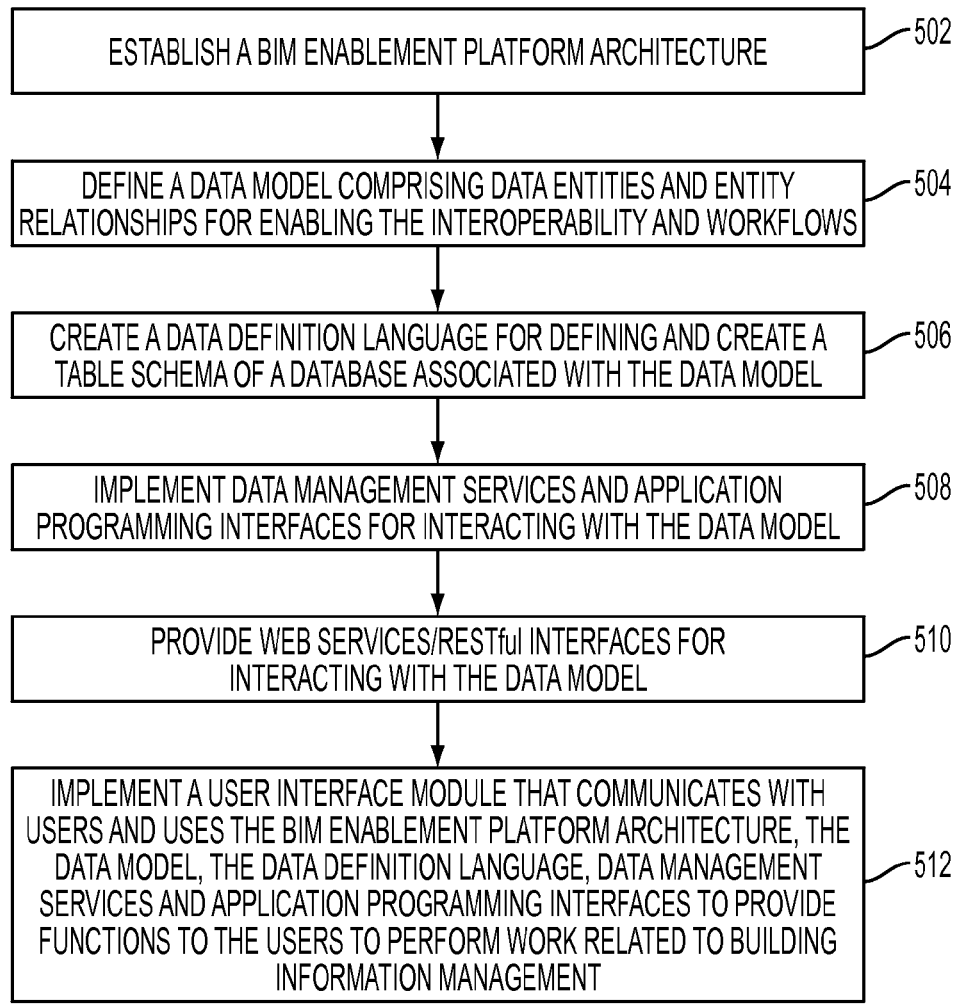
FIG. 5 illustrates a method in one embodiment of the present disclosure for establishing an instance of the BIM enablement platform that provides functions to enable the users and administrators to perform work and/or submit jobs related to building information management, e.g., jobs and/or workflows for end-to-end interoperability from building architecture design to one or more simulations.

FIG. 5 illustrates a method in one embodiment of the present disclosure for establishing an instance of the BIM enablement platform that provides functions to enable the users and administrators to perform work and/or submit jobs related to building information management, e.g., jobs and/or workflows for end-to-end interoperability from building architecture design to one or more simulations. At 502, BIM enablement platform architecture may be established. In one embodiment, the BIM enablement platform architecture comprises a Web-based graphical user interface portal layer, RESTful Interfaces (or web services) layer, data management services and application program interfaces layer and data model layer.

At 504, a data model may be defined comprising data entities and entity relationships for enabling the interoperability and workflows. The data entities may comprise BIMUser, BIMRole, BIMProject, UserProject ExternInfo, FormatMapping, XMLSchema, NonXMLSchema, MVDTemplate, and BIMRepository. The entity relationships may comprise BIMUser and UserProject, UserProject and BIMUser, UserProject and BIMRole, BIMProject and ExternInfo, BIMProject and FormatMapping, BIMProject and BIMRepository, FormatMapping and XMLSchema, FormatMapping and NonXMLSchema, FormatMapping and MVDTemplate, BIMRepository and FormatMapping, BIMRepository and MVDTemplate, ExternInfo and XMLSchema.

At 506, a data definition language may be created for defining and creating a table schema of a database associated with the data model. The data definition language may comprise sequential query language statements that define and create database table definitions to store and retrieve data in the database for the BIM enablement platform.

At 508, data management services and/or application programming interfaces may be implemented for interacting with the data model. The data management services may comprise definitions of functions for User, Project, Role, Repository, ACL, externInfo, XMLSchema, NonXMLSchema, FormatMapping, MVDTemplate, BIM Object query APIs, model verification AND revision control. The application programming interfaces may comprise interfaces for interacting with the data entities. The interfaces may comprise at least interfaces for adding, getting, updating, and deleting data associated with the data entities.

At 510, web services may be provided for interacting with the data model. For example, RESTful interfaces may be provided. The RESTful interfaces may comprise Web interface definitions that enable selected one or more of the data management services and/or application programming interfaces to be accessible via the Internet.

At 512, a user interface module may be implemented that communicates with users and uses the BIM enablement platform architecture, the data model, the data definition language, data management services and application programming interfaces to provide functions to the users to perform work related to building information management. The work related to building information management BIM may comprise format translation, for example translations of input and output files of building design tools and building simulation tools. The work related to building information management may comprise BIM workflow execution, e.g., from design to simulation. The user interface module may comprise at least a user management functionality, fine-grained access control functionality, project management functionality, repository management functionality and application support functionality.

In one embodiment of the present disclosure, the end-to-end interoperability and workflows from building architecture design to one or more simulations may be provided over a distributed network of computing platforms, e.g., over a cloud computing infrastructure. The examples of simulations may be energy, lighting, airflow, and contaminant in building simulation.

Figure 6:
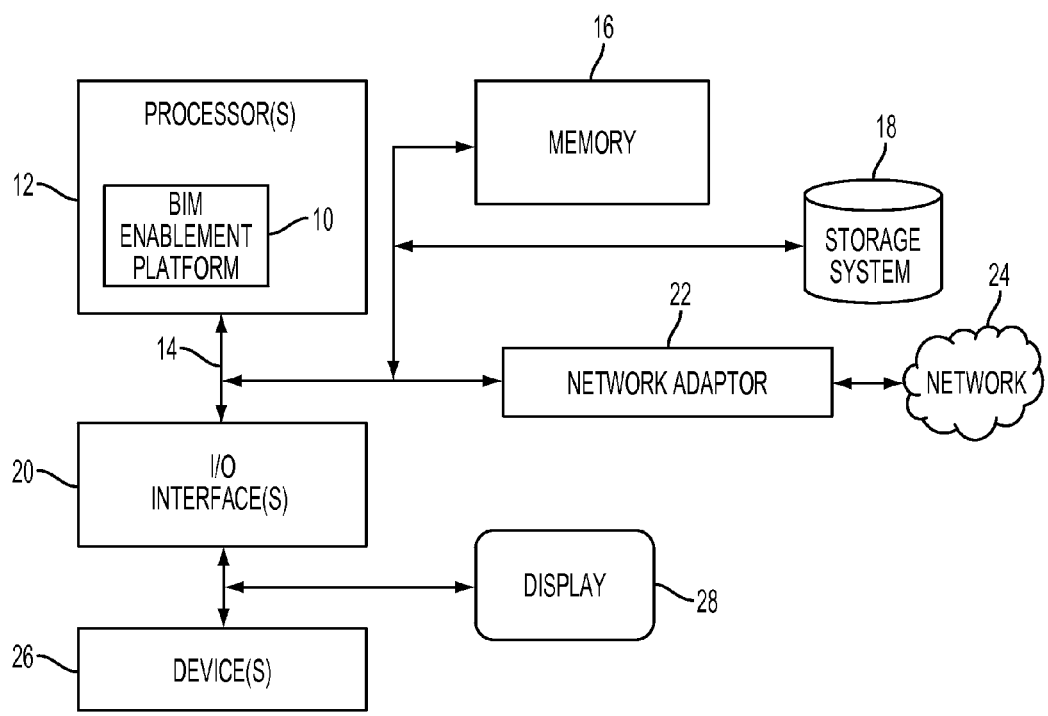
FIG. 6 illustrates a schematic of an example computer or processing system that may implement the BIM enablement platform in one embodiment of the present disclosure.

FIG. 6 illustrates a schematic of an example computer or processing system that may implement the BIM enablement platform in one embodiment of the present disclosure. The computer system is only one example of a suitable processing system and is not intended to suggest any limitation as to the scope of use or functionality of embodiments of the methodology described herein. The processing system shown may be operational with numerous other general purpose or special purpose computing system environments or configurations. Examples of well-known computing systems, environments, and/or configurations that may be suitable for use with the processing system shown in FIG. 6 may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

The computer system may be described in the general context of computer system executable instructions, such as program modules, being executed by a computer system. Generally, program modules may include routines, programs, objects, components, logic, data structures, and so on that perform particular tasks or implement particular abstract data types. The computer system may be practiced in distributed cloud computing environments where tasks are performed by remote processing devices that are linked through a communications network. In a distributed cloud computing environment, program modules may be located in both local and remote computer system storage media including memory storage devices.

The components of computer system may include, but are not limited to, one or more processors or processing units 12, a system memory 16, and a bus 14 that couples various system components including system memory 16 to processor 12. The processor 12 may include one or more components of a BIM enablement platform 10 that performs the methods described herein. The module 10 may be programmed into the integrated circuits of the processor 12, or loaded from memory 16, storage device 18, or network 24 or combinations thereof.

Bus 14 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system may include a variety of computer system readable media. Such media may be any available media that is accessible by computer system, and it may include both volatile and non-volatile media, removable and non-removable media.

System memory 16 can include computer system readable media in the form of volatile memory, such as random access memory (RAM) and/or cache memory or others. Computer system may further include other removable/non-removable, volatile/non-volatile computer system storage media. By way of example only, storage system 18 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 14 by one or more data media interfaces.

Computer system may also communicate with one or more external devices 26 such as a keyboard, a pointing device, a display 28, etc.; one or more devices that enable a user to interact with computer system; and/or any devices (e.g., network card, modem, etc.) that enable computer system to communicate with one or more other computing devices. Such communication can occur via Input/Output (I/O) interfaces 20.

Still yet, computer system can communicate with one or more networks 24 such as a local area network (LAN), a general wide area network (WAN), and/or a public network (e.g., the Internet) via network adapter 22. As depicted, network adapter 22 communicates with the other components of computer system via bus 14. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages, a scripting language such as Perl, VBS or similar languages, and/or functional languages such as Lisp and ML and logic-oriented languages such as Prolog. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The computer program product may comprise all the respective features enabling the implementation of the methodology described herein, and which—when loaded in a computer system—is able to carry out the methods. Computer program, software program, program, or software, in the present context means any expression, in any language, code or notation, of a set of instructions intended to cause a system having an information processing capability to perform a particular function either directly or after either or both of the following: (a) conversion to another language, code or notation; and/or (b) reproduction in a different material form.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Various aspects of the present disclosure may be embodied as a program, software, or computer instructions embodied in a computer or machine usable or readable medium, which causes the computer or machine to perform the steps of the method when executed on the computer, processor, and/or machine. A program storage device readable by a machine, tangibly embodying a program of instructions executable by the machine to perform various functionalities and methods described in the present disclosure is also provided.

The system and method of the present disclosure may be implemented and run on a general-purpose computer or special-purpose computer system. The terms "computer system" and "computer network" as may be used in the present application may include a variety of combinations of fixed and/or portable computer hardware, software, peripherals, and storage devices. The computer system may include a plurality of individual components that are networked or otherwise linked to perform collaboratively, or may include one or more stand-alone components. The hardware and software components of the computer system of the present application may include and may be included within fixed and portable devices such as desktop, laptop, and/or server. A module may be a component of a device, software, program, or system that implements some "functionality", which can be embodied as software, hardware, firmware, electronic circuitry, or etc.

The embodiments described above are illustrative examples and it should not be construed that the present invention is limited to these particular embodiments. Thus, various changes and modifications may be effected by one skilled in the art without departing from the spirit or scope of the invention as defined in the appended claims.

We claim:

1. A method for an end-to-end interoperability and workflows from building architecture design to one or more simulations, comprising:
   establishing building information modeling (BIM) enablement platform architecture;
   defining a data model comprising data entities and entity relationships for enabling the interoperability and workflows among building design, a plurality of simulations and building operations;
   creating a data definition language for defining and creating a table schema of a database associated with the data model;
   implementing data management services and application programming interfaces for interacting with the data model; and
   implementing a user interface module that communicates with users and uses the BIM enablement platform architecture, the data model, the data definition language, data management services and application programming interfaces to provide functions to the users to perform work related to building information management,
   wherein the data entities comprise at least a format translation data entity and a format mapping data entity that store data associated with performing a format translation function comprising at least how data is to be extracted from one or more source files and mapped,
   wherein a user is allowed to populate instances of the data entities to create a project, and responsive to the user invoking a code specified via the data entities, the method further comprises automatically transforming, via the format translation data entity and the format mapping data entity, an output of the building design to one or more formats of one or more of the plurality of simulations based on the data populated in the format translation data entity and a format mapping data entity,
   wherein responsive to a user command, the method further comprises automatically running one or more of the plurality of simulations based on data stored in the instances of the data entities and the translated output of the building design, and
   wherein the data entities enable translation of data from one of the plurality of simulations to another one of the plurality of simulations.

2. The method of claim 1, further comprising:
   providing web services for interacting with the data model.

3. The method of claim 2, wherein the web services comprises RESTful interfaces.

4. The method of claim 3, wherein the RESTful interfaces comprise Web interface definitions that enable selected one or more of the data management services and application programming interfaces to be accessible via an Internet.

5. The method of claim 1, wherein the work related to building information management comprises format translation.

6. The method of claim 1, wherein the work related to building information management comprises BIM workflow execution.

7. The method of claim 1, wherein the BIM enablement platform architecture comprises a Web-based graphical user interface portal layer, web services layer, data management services and application program interfaces layer and data model layer.

8. The method of claim 1, wherein the data entities comprise BIMUser, BIMRole, BIMProject, UserProject ExternInfo, FormatMapping, XMLSchema, NonXMLSchema, MVDTemplate, and BIMRepository.

9. The method of claim 1, wherein the entity relationships comprise BIMUser and UserProject, UserProject and BIMUser, UserProject and BIMRole, BIMProject and ExternInfo, BIMProject and FormatMapping, BIMProject and BIMRepository, FormatMapping and XMLSchema, FormatMapping and NonXMLSchema, FormatMapping and MVDTemplate, BIMRepository and FormatMapping, BIMRepository and MVDTemplate, ExternInfo and XMLSchema.

10. The method of claim 1, wherein the data definition language comprises sequential query language statements that define and create database table definitions to store and retrieve data in the database for the BIM enablement platform.

11. The method of claim 1, wherein the data management services comprise definitions of functions for User, Project, Role, Repository, ACL, externInfo, XMLSchema, NonXMLSchema, FormatMapping, MVDTemplate, BIM Object query APIs, model verification AND revision control.

12. The method claim 11, the application programming interfaces comprise interfaces for interacting with the data entities.

13. The method of claim 12, wherein the interfaces comprises at least interfaces for adding, getting, updating, and deleting data associated with the data entities.

14. The method of claim 1, wherein the user interface module comprises at least a user management functionality, fine-grained access control functionality, project management functionality, repository management functionality and application support functionality.

15. The method of claim 1, wherein the end-to-end interoperability and workflows from building architecture design to one or more simulations is provided over a distributed network of computing platforms.

16. The method of claim 1, wherein the simulations comprises at least one or more of energy, lighting, airflow, or contaminant.

17. A method for end-to-end interoperability and workflows from building architecture design to one or more simulations, comprising:
   interacting with a data model via a user interface or an application programming interface or combinations of both integrated on a building information management enablement platform, wherein the data model comprises at least a user data entity, a user role data entity, a project data entity, an external information data entity, a format mapping data entity, an XML schema data entity, a none XML schema data entity, a model view definition template data entity and a repository data entity, the interacting comprising at least:
   creating a user data entity instance and populating one or more fields associated with the user data entity in the user data entity instance;
   creating a project data entity instance of the defined data model and populating one or more fields associated with the project data entity instance;
   adding external information data for simulation runs into an external information data entity instance;
   adding user role information to a user role data entity instance;
   creating one or more links to a file format and schema by populating a format mapping data entity instance and a schema data entity instance;
   creating a model view definition template data entity instance for translation of a building architecture design output format to a simulation input format, and populating the model view definition template data entity instance;

creating an input file by populating a repository data entity instance to identify the input file and the model view definition template data entity instance; and running a simulation code associated with said one or more simulations with the data of the external information data entity instance and a transformed input file that is transformed using the populated model view definition template data entity instance, wherein the model view definition template data entity instance stores at least data associated with performing a format translation function comprising at least how data is to be extracted from one or more source files and mapped, wherein a user is allowed to populate the model view definition template data entity instance and the format mapping data entity instance, wherein responsive to the user invoking a code specified in the external information data entity instance, the method further comprises automatically transforming, via at least the model view definition template data entity instance and the format mapping data entity instance, an output of the building design to one or more formats of one or more of the plurality of simulations based on the data populated in the model view definition template data entity instance and the format mapping data entity instance, wherein responsive to a user command, the method further comprises automatically performing said running a simulation code.

18. The method of claim 17, wherein the input file is an IFC file and the transformed input file is in CONTAM format.

19. The method of claim 17, wherein the input file is an IFC file and the transformed input file is in EnergyPlus format.

20. The method of claim 17, wherein the input file is an IFC file and the transformed input file is in Radiance format.

* * * * *